United States Patent
Hendrickson

(10) Patent No.: US 8,806,263 B2
(45) Date of Patent: Aug. 12, 2014

(54) METHODS AND APPARATUSES INCLUDING A GLOBAL TIMING GENERATOR AND LOCAL CONTROL CIRCUITS

(75) Inventor: Nicholas T. Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 376 days.

(21) Appl. No.: 13/219,509

(22) Filed: Aug. 26, 2011

(65) Prior Publication Data

US 2013/0055003 A1 Feb. 28, 2013

(51) Int. Cl.
- *G06F 1/00* (2006.01)
- *G06F 1/04* (2006.01)
- *G06F 1/26* (2006.01)
- *G06F 1/32* (2006.01)

(52) U.S. Cl.
USPC ............ 713/600; 713/300; 713/500; 711/100

(58) Field of Classification Search
USPC ............................. 713/300, 500, 600; 711/100
See application file for complete search history.

(56) References Cited

U.S. PATENT DOCUMENTS

| | | | |
|---|---|---|---|
| 4,451,882 A * | 5/1984 | Dshkhunian et al. | 712/32 |
| 5,956,473 A * | 9/1999 | Ma et al. | 714/5.1 |
| 6,813,633 B2 * | 11/2004 | Wong et al. | 709/217 |
| 7,222,137 B2 * | 5/2007 | Terazono et al. | 1/1 |
| 7,391,643 B2 * | 6/2008 | Fuji | 365/163 |
| 7,568,082 B2 * | 7/2009 | Hoogerbrugge | 711/170 |
| 7,843,737 B2 | 11/2010 | Theoduloz et al. | |
| 8,213,220 B2 * | 7/2012 | Wang et al. | 365/158 |
| 2006/0053295 A1 * | 3/2006 | Madhusudan et al. | 713/181 |
| 2006/0248258 A1 * | 11/2006 | Persoon | 711/1 |
| 2007/0028060 A1 * | 2/2007 | Ware et al. | 711/154 |
| 2007/0061504 A1 * | 3/2007 | Lee | 711/103 |
| 2007/0214378 A1 * | 9/2007 | Hsieh et al. | 713/401 |
| 2008/0215940 A1 * | 9/2008 | Burlison et al. | 714/726 |
| 2010/0296352 A1 | 11/2010 | Choi et al. | |
| 2010/0315883 A1 | 12/2010 | Lee | |
| 2011/0058433 A1 | 3/2011 | Choi et al. | |
| 2011/0099326 A1 * | 4/2011 | Jung et al. | 711/103 |
| 2011/0126039 A1 * | 5/2011 | Kim et al. | 713/501 |

* cited by examiner

*Primary Examiner* — Mark Connolly
(74) *Attorney, Agent, or Firm* — Schwegman, Lundberg & Woessner, P.A.

(57) ABSTRACT

Apparatus and methods are disclosed, such as a global timing generator coupled to local control circuits. Each local control circuit can control programming and reading of a memory element in a tile of memory elements in an array responsive to a timing signal(s) from the global timing generator. Additional apparatus and methods are described.

19 Claims, 6 Drawing Sheets

METHODS AND APPARATUSES INCLUDING A GLOBAL TIMING GENERATOR AND LOCAL CONTROL CIRCUITS

BACKGROUND

Semiconductor memory devices are used in many electronic devices such as personal digital assistants (PDAs), laptop computers, mobile phones and digital cameras. Some of these semiconductor memory devices have arrays of charge storage transistors.

BRIEF DESCRIPTION OF THE DRAWINGS

Some embodiments are illustrated by way of example and not limitation in the figures of the accompanying drawings in which.

DETAILED DESCRIPTION

A continual challenge for semiconductor device makers is to produce semiconductor devices that process or store more information in a smaller volume of semiconductor material. The inventor has discovered that the challenge noted above, as well as others, can be addressed with a global timing generator coupled to local control circuits. Each local control circuit can control programming and reading of memory elements in a tile of memory elements in an array responsive to (e.g., in response to or based at least in part on) timing signals from the global timing generator.

In this description, a transistor is described as being activated or switched on when it is rendered conductive by a control terminal voltage that is separated from its source voltage by at least its threshold voltage. The transistor is described as being in an inactive state or switched off when the control terminal voltage is separated from its source voltage by less than the threshold voltage and the transistor is rendered non-conductive.

Figure 1:
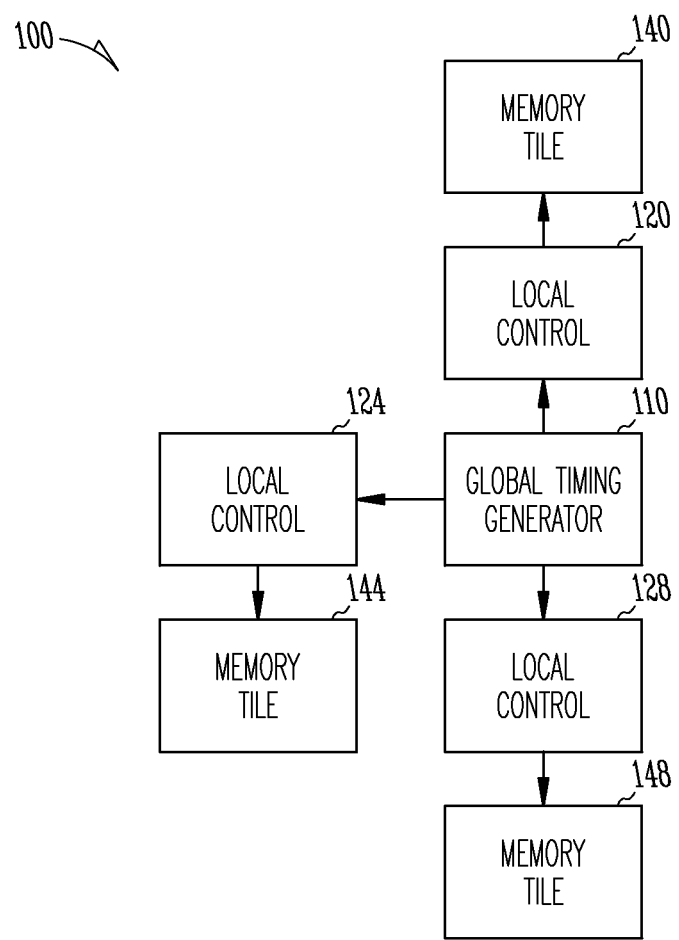
FIG. 1 is a block diagram of an apparatus in the form of a memory system according to various embodiments of the invention.

FIG. 1 is a block diagram of an apparatus in the form of a memory system 100 according to various embodiments of the invention. The memory system 100 can represent a single bank of memory elements in a memory device. The memory system 100 is controlled by a global timing generator 110 that can generate timing signals to sequence read and program (e.g., write) operations in the memory system 100. The global timing generator 110 can be, for example, a delay chain, a state machine or a microcontroller. The global timing generator 110 is coupled to provide timing signals to multiple local control circuits 120, 124 and 128. Each of the local control circuits 120, 124 and 128 can control read and program operations in a single respective tile 140, 144 and 148 of memory elements based on the timing signals from the global timing generator 110. For the purposes of this document, a tile of memory elements comprises an array of memory elements in a larger grouping of memory elements such as a bank of memory elements. The local control circuit 120 can control read and program operations in the memory elements of the tile 140. The local control circuit 124 can control read and program operations in the memory elements of the tile 144. The local control circuit 128 can control read and program operations in the memory elements of the tile 148. The memory system 100 can include more than three local control circuits 120, 124 and 128 coupled to receive timing signals from the global timing generator 110 according to various embodiments of the invention.

Figure 2:
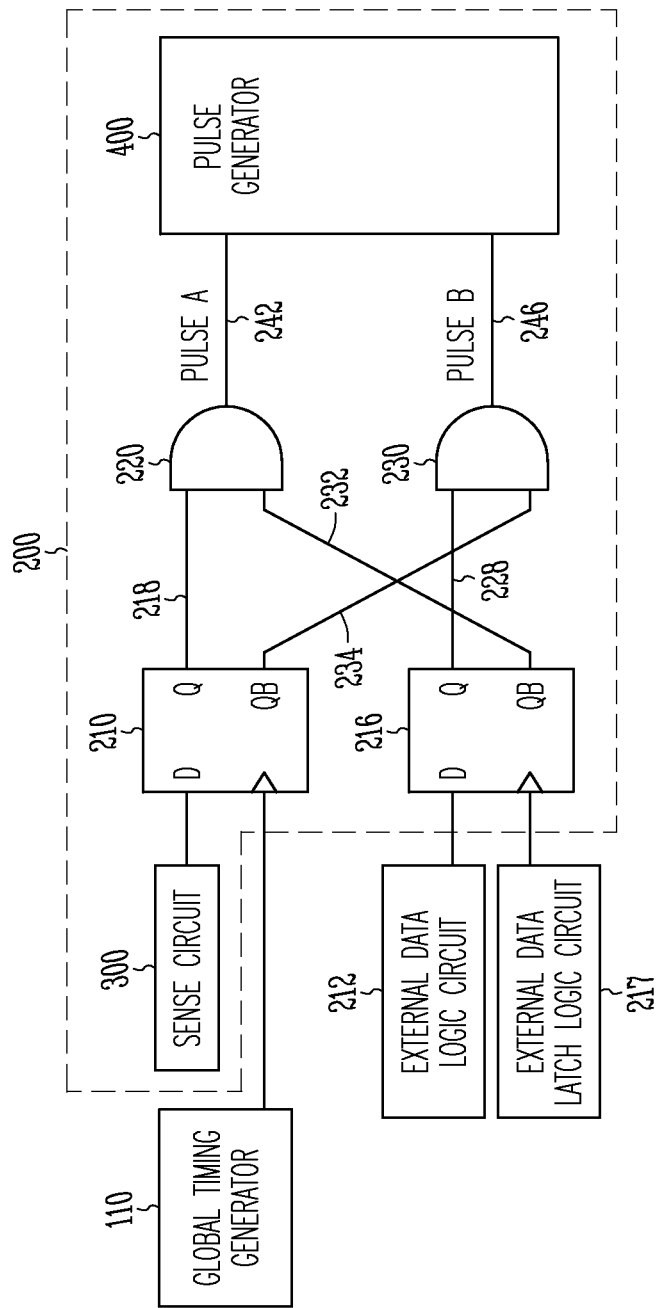
FIG. 2 is an electrical schematic diagram of a local control circuit according to various embodiments of the invention.

FIG. 2 is an electrical schematic diagram of a local control circuit 200 according to various embodiments of the invention. A current sensed state of a memory element (not shown) is received from a sense circuit 300 in a D input of a first D flip flop 210. The sense circuit 300 is described herein with reference to FIG. 3. The memory element holds, for example, one of two or more states, such as a "0" or a "1". The sensed state of the memory element is transferred to a Q output of the first D flip flop 210 by a rising edge of a sense latch signal from the global timing generator 110. External data from an external data logic circuit 212 is received in a D input of a second D flip flop 216. The external data is transferred from the D input to a Q output of the second D flip flop 216 by a rising edge of an external data latch signal from an external data latch logic circuit 217. The external data logic circuit 212 and the external data latch logic circuit 217 receive the external data and the external data latch signal from a source outside the memory system 100.

The local control circuit 200 can operate to store the external data in the memory element in the following manner. The current sensed state of the memory element is coupled from the Q output of the first D flip flop 210 to a first input 218 of a first AND gate 220. The external data is coupled from the Q output of the second D flip flop 216 to a first input 228 of a second AND gate 230. A QB output of the second D flip flop 216 is coupled to a second input 232 of the first AND gate 220, and a QB output of the first D flip flop 210 is coupled to a second input 234 of the second AND gate 230.

The first AND gate 220 generates a pulse A signal at an output 242 that is coupled to a pulse generator 400, and the second AND gate 230 generates a pulse B signal at an output 246 that is coupled to the pulse generator 400. The pulse generator 400 is described herein with reference to FIG. 4. The pulse A signal and the pulse B signal determine whether the memory element will be programmed. If the current sensed state of the memory element is a "1" and the external data is a "0", the pulse A signal will be high and the pulse B signal will be low. If the sensed state of the memory element is "0" and the external data is "1", the pulse B signal will be high and the pulse A signal will be low. If the sensed state of the memory element is a "1" and the external data is also a "1", the pulse A signal will be low and the pulse B signal will also be low. If the sensed state of the memory element is a "0" and the external data is also a "0", the pulse A signal will be low and the pulse B signal will also be low. The memory element will be programmed if the external data is different from the sensed state of the memory element which results in either the pulse B signal or the pulse A signal being high.

The local control circuit 200 includes all of the features shown in FIG. 2 except for the global timing generator 110, the external data logic circuit 212 and the external data latch logic circuit 217. The local control circuit 200 includes the sense circuit 300, the first D flip flop 210, the second D flip flop 216, the first AND gate 220, the second AND gate 230 and the pulse generator 400. The local control circuit 200 is an embodiment of each of the local control circuits 120, 124 and 128 shown in FIG. 1.

Figure 3:
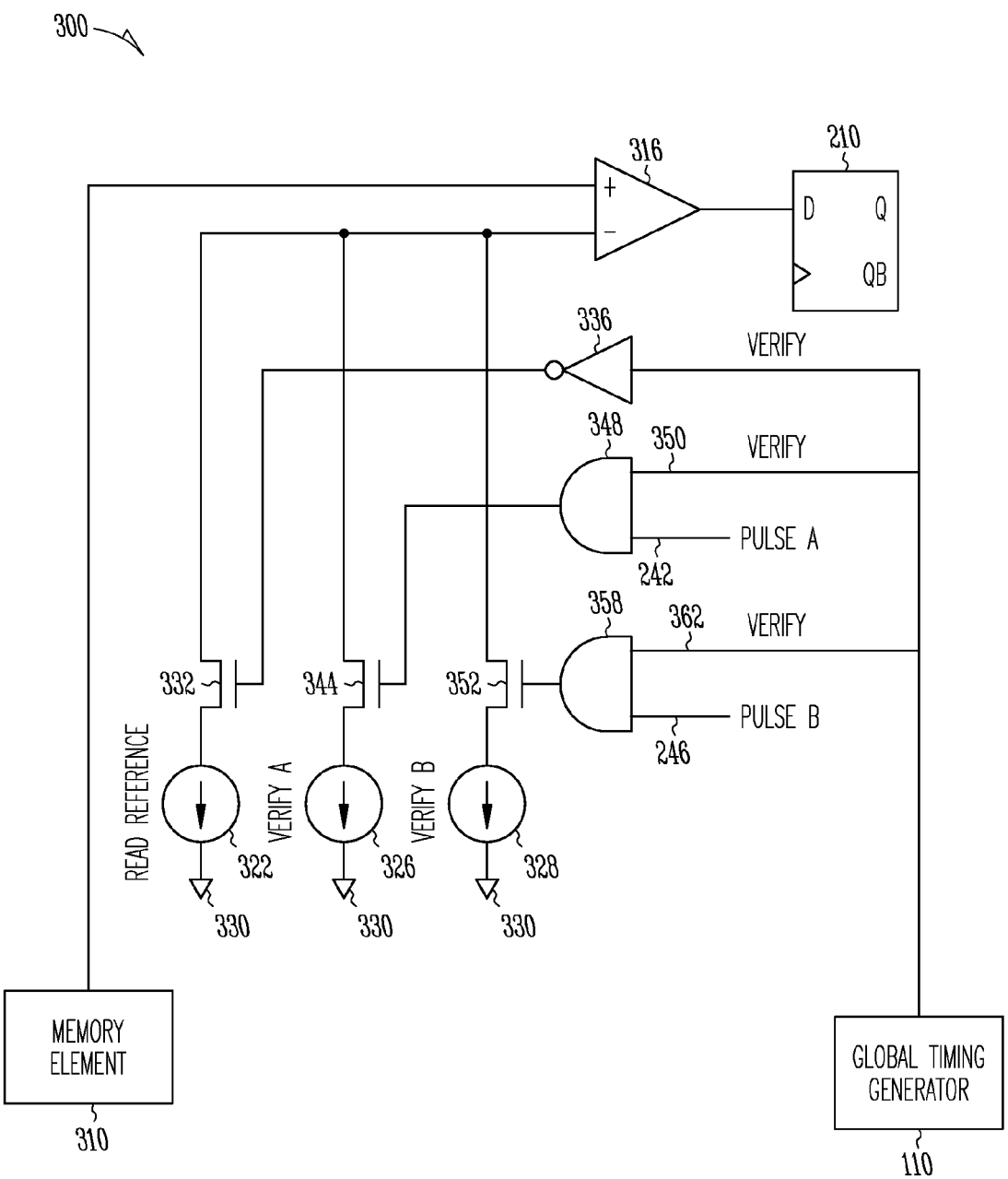
FIG. 3 is an electrical schematic diagram of a sense circuit according to various embodiments of the invention.

FIG. 3 is an electrical schematic diagram of a sense circuit 300 according to various embodiments of the invention. The sense circuit 300 can determine a state of a memory element 310 and provide a resulting signal to the D input of the first D flip flop 210 as described above. The memory element 310 is a physical structure capable of holding, for example, one of two or more states. The memory element 310 can be, for example, a charge trap layer cell, a floating gate transistor, a resistive cell, a magnetoresistive cell or a phase change cell. The memory element 310 is coupled to a non-inverting input of a comparator 316 to sense the state of the memory element 310. An inverting input of the comparator 316 is coupled to one of three current sources to be compared with current in the memory element 310 in the comparator 316.

A read reference current source 322 is coupled between a ground voltage reference 330 and a source of a first n-channel transistor 332. A drain of the first n-channel transistor 332 is coupled to the inverting input of the comparator 316. A verify A current source 326 is coupled between the ground voltage reference 330 and a source of a second n-channel transistor 344. A drain of the second n-channel transistor 344 is coupled to the inverting input of the comparator 316. A verify B current source 328 is coupled between the ground voltage reference 330 and a source of a third n-channel transistor 352. A drain of the third n-channel transistor 352 is coupled to the inverting input of the comparator 316.

The amount of current drawn by the read reference current source 322 is between the amount of current drawn by the verify B current source 328 and the amount of current drawn by the verify A current source 326. Currents drawn by the memory element 310 and the current sources 322, 326 and 328 are translated into signals that are provided to the comparator 316. A low current is translated into a high signal on the comparator 316, and a higher current is translated into a lower signal on the comparator 316.

A gate of the first n-channel transistor 332 is coupled to an output of an inverter 336, and an input of the inverter 336 is coupled to receive a verify signal from the global timing generator 110. The verify signal is high when the state of the memory element 310 is to be verified after being programmed or erased. The high verify signal is inverted by the inverter 336 into a low signal that switches off the first n-channel transistor 332 to substantially isolate the read reference current source 322 from the comparator 316. The read reference current source 322 is used to read the state of the memory element 310 when it is not being verified and the verify signal is low. The low verify signal is inverted by the inverter 336 into a high signal that switches on the first n-channel transistor 332 to couple the read reference current source 322 to the comparator 316.

A gate of the second n-channel transistor 344 is coupled to an output of a third AND gate 348. A first input 350 of the third AND gate 348 is coupled to the verify signal from the global timing generator 110, and the pulse A signal on the output 242 from the local control circuit 200 is provided to a second input of the third AND gate 348. The third AND gate 348 generates a high signal on its output when both the verify signal and the pulse A signal are high. The high signal on the output of the third AND gate 348 switches on the second n-channel transistor 344 to couple the verify A current source 326 to the comparator 316.

A gate of the third n-channel transistor 352 is coupled to an output of a fourth AND gate 358. A first input of the fourth AND gate 358 is coupled to the verify signal from the global timing generator 110, and the pulse B signal on the output 246 from the local control circuit 200 is provided to a second input of the fourth AND gate 358. The fourth AND gate 358 generates a high signal on its output when both the verify signal and the pulse B signal are high. The high signal on the output of the fourth AND gate 358 switches on the third n-channel transistor 352 to couple the verify B current source 328 to the comparator 316.

The sense circuit 300 can sense a state of the memory element 310 by comparing current through the memory element 310 with current in the read reference current source 322. The verify signal from the global timing generator 110 is low during a read operation to result in low outputs from the third AND gate 348 and the fourth AND gate 358 to switch off the second n-channel transistor 344 and the third n-channel transistor 352, respectively. The low verify signal is inverted by the inverter 336 to a high signal to switch on the first n-channel transistor 332 to couple the read reference current source 322 to the inverting input of the comparator 316. A signal representing current in the memory element 310 is compared with a signal representing current in the read reference current source 322 in the comparator 316, and the comparator 316 generates an output signal to indicate a state of the memory element 310. The output signal of the comparator 316 is provided to the D input of the first D flip flop 210 as described above.

The programming of a value in the memory element 310 indicated by pulse A is verified by a comparison between current in the memory element 310 with current in the verify A current source 326. The global timing generator 110 generates a high verify signal that is inverted by the inverter 336 into a low signal that switches off the first n-channel transistor 332. The high verify signal is provided to the first inputs 350 and 362 of the third and fourth AND gates 348 and 358 to enable the third and fourth AND gates 348 and 358 to have high outputs. The pulse A signal on the output 242 is also high following a programming of the memory element 310 such that the third AND gate 348 generates a high output that is provided to the gate of the second n-channel transistor 344 to switch on the second n-channel transistor 344 to couple the verify A current source 326 to the inverting input of the comparator 316. The pulse B signal on the output 246 is low such that the output of the fourth AND gate 358 is low to switch off the third n-channel transistor 352. A signal representing current in the memory element 310 is compared with a signal representing current in the verify A current source 326 in the comparator 316 that generates an output signal to indicate a state of the memory element 310. The output signal of the comparator 316 is provided to the D input of the first D flip flop 210 as described above.

The programming of a value in the memory element 310 indicated by pulse B is verified by a comparison between current in the memory element 310 with current in the verify B current source 328. The global timing generator 110 generates a high verify signal that is inverted by the inverter 336 into a low signal that switches off the first n-channel transistor 332. The high verify signal is provided to the first inputs 350 and 362 of the third and fourth AND gates 348 and 358 to enable the third and fourth AND gates 348 and 358 to have high outputs. The pulse B signal on the output 246 is also high following a programming of the memory element 310 such that the fourth AND gate 358 generates a high output that is provided to the gate of the third n-channel transistor 352 to switch on the third n-channel transistor 352 to couple the verify B current source 328 to the inverting input of the comparator 316. The pulse A signal on the output 242 is low such that the output of the third AND gate 348 is low to switch off the second n-channel transistor 344. A signal representing current in the memory element 310 is compared with a signal representing current in the verify B current source 328 in the comparator 316 that generates an output signal to indicate a state of the memory element 310. The output signal of the comparator 316 is provided to the D input of the first D flip flop 210 as described above.

Figure 4:
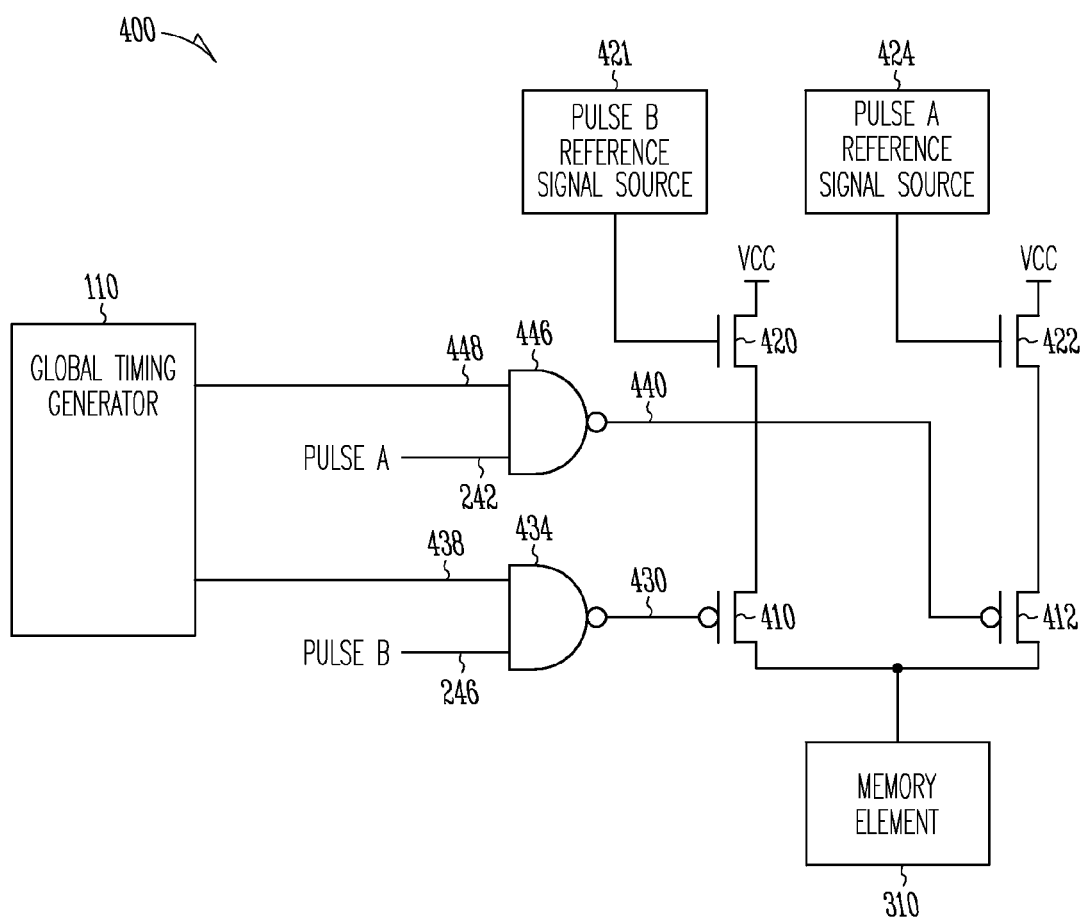
FIG. 4 is an electrical schematic diagram of a pulse generator according to various embodiments of the invention.

FIG. 4 is an electrical schematic diagram of the pulse generator 400 according to various embodiments of the invention. The memory element 310 is coupled to receive a supply voltage VCC from either a first p-channel transistor 410 or a second p-channel transistor 412. A drain of the first p-channel transistor 410 is coupled to the memory element 310 and a source of the first p-channel transistor 410 is coupled to a source of a first n-channel transistor 420. A drain of the first n-channel transistor 420 is coupled to the supply voltage VCC, and a gate of the first n-channel transistor 420 is coupled to receive a pulse B reference signal from a pulse B reference signal source 421. The pulse B reference signal programs the memory element 310 and can be a declining ramp voltage signal.

A drain of the second p-channel transistor 412 is coupled to the memory element 310, and a source of the second p-channel transistor 412 is coupled to a drain of a second n-channel transistor 422. A drain of the second n-channel transistor 422 is coupled to the supply voltage VCC, a control gate of the second n-channel transistor 422 is coupled to receive a pulse A reference signal. The pulse A reference signal programs the memory element 310 and can be a direct current (DC) voltage from a pulse A reference signal source 424 on an integrated circuit chip including the pulse generator 400 according to various embodiments of the invention. Programming by the pulse A reference signal source 424 will result in a different value stored in the memory element 310 than programming by the pulse B reference signal source 421. The timing of the signals from the pulse A reference signal source 424 and the pulse B reference signal source 421 may be controlled by the global timing generator 110 according to various embodiments of the invention.

The first p-channel transistor 410 is switched on by a low signal on an output 430 of a first NAND gate 434. A first input 438 of the first NAND gate 434 is coupled to receive a timing signal from a global timing generator 110, and a second input of the first NAND gate 434 is coupled to receive the pulse B signal from the output 246 of the local control circuit 200 to switch on the first p-channel transistor 410 when the pulse B signal is high and when the global timing generator 110 indicates that the memory element 310 is to be programmed by bringing a timing signal high on the first input 438 of the first NAND gate 434.

The second p-channel transistor 412 is switched on by a low signal on an output 440 of a second NAND gate 446. A first input 448 of the second NAND gate 446 is coupled to receive a timing signal from the global timing generator 110, and a second input of the second NAND gate 446 is coupled to receive the pulse A signal from the output 242 of the local control circuit 200 to switch on the second p-channel transistor 412 when the pulse A signal is high and when the global timing generator 110 indicates that the memory element 310 is to be programmed by bringing a timing signal high on the first input 448 of the second NAND gate 446.

The memory element 310 is programmed when a gate of the first p-channel transistor 410 is coupled to a low signal from the output 430 of the first NAND gate 434. The memory element 310 is programmed through the first p-channel transistor 410 and the first n-channel transistor 420 by being coupled to the supply voltage VCC for a time dictated by the pulse B reference signal on the gate of the first n-channel transistor 420. The memory element 310 is programmed when a gate of the second p-channel transistor 412 is coupled to a low signal from the output 440 of the second NAND gate 446. The memory element 310 is programmed through the second p-channel transistor 412 and the second n-channel transistor 422 by being coupled to the supply voltage VCC for a time dictated by the pulse A reference signal on the gate of the second n-channel transistor 422.

Figure 5:
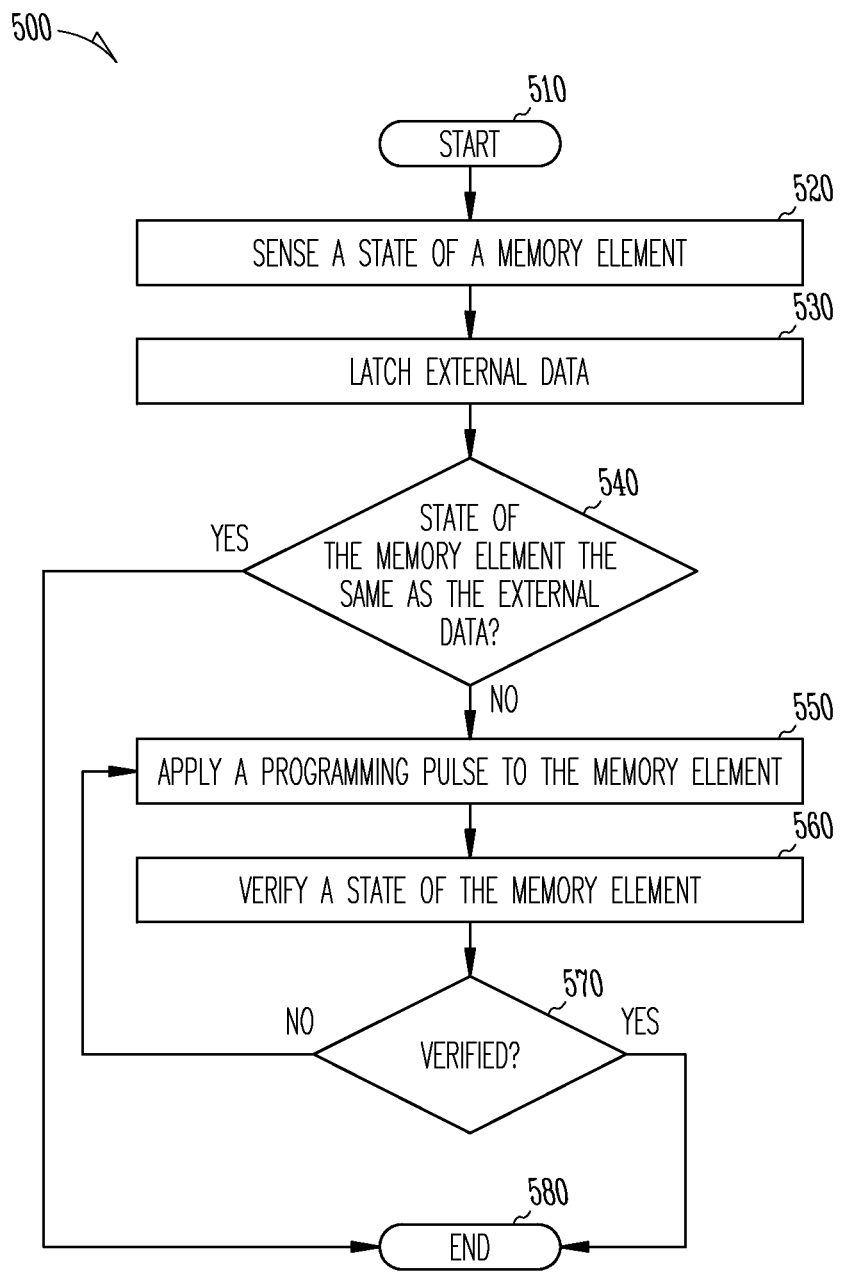
FIG. 5 is a flow diagram of one method according to various embodiments of the invention.

FIG. 5 is a flow diagram of one method 500 according to various embodiments of the invention. In block 510, the method 500 starts. In block 520, a state of a memory element is sensed. In block 530, external data for the memory element is latched. In block 540, the method 500 determines if the state of the memory element is the same as the external data. If the state of the memory element is the same as the external data, the method 500 ends in block 580. If the state of the memory element is not the same as the external data, a programming pulse is applied to the memory element in block 550. In block 560, a state of the memory element is verified. In block 570, the method 500 determines if the state of the memory element is verified. If the state of the memory element is the same as the external data, the method 500 ends in block 580. If the state of the memory element is not the same as the external data, the method 500 returns to block 550. Various embodiments may have more or fewer activities than those shown in FIG. 5.

Figure 6:
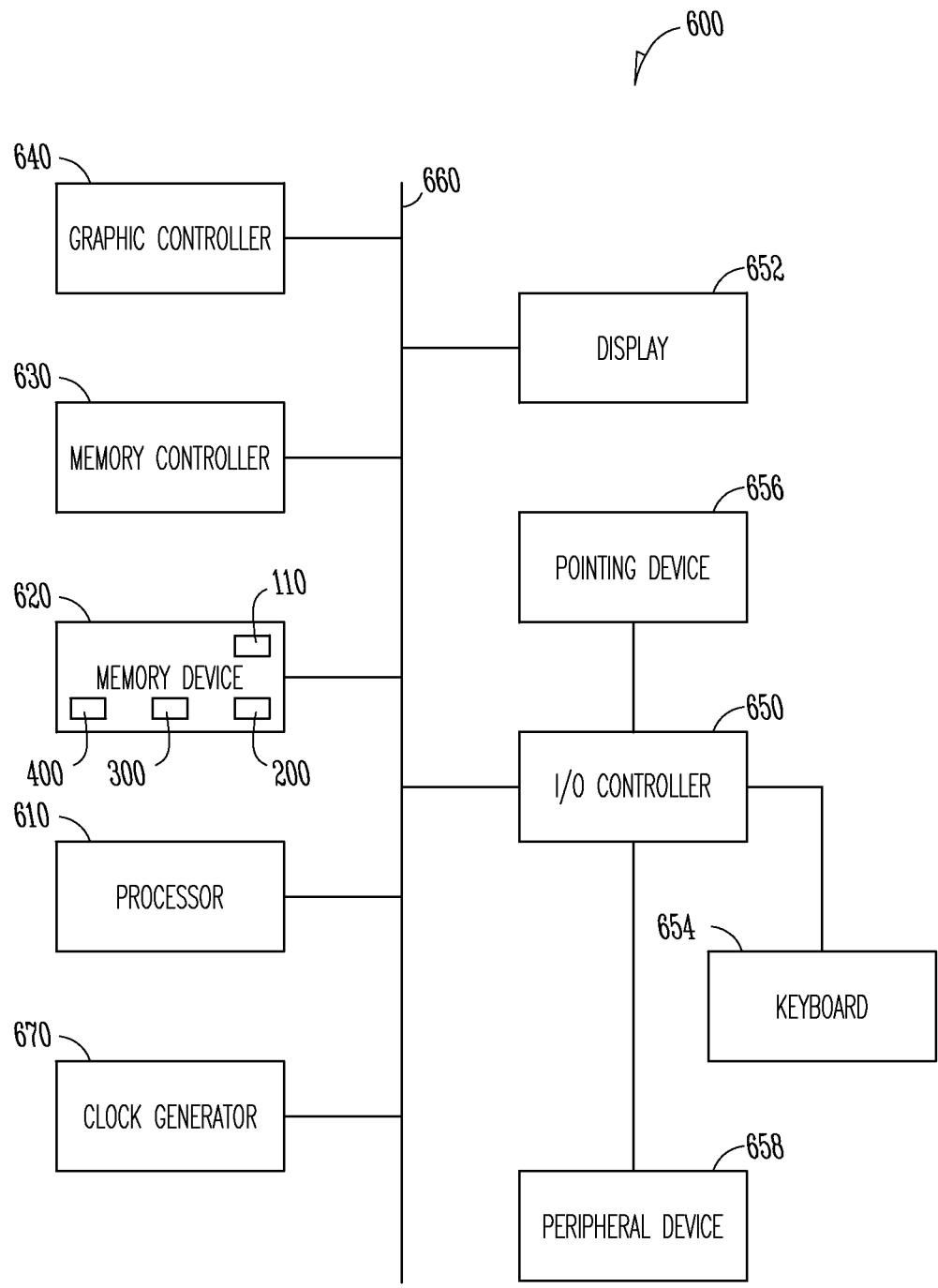
FIG. 6 is a diagram illustrating an apparatus in the form of a system according to various embodiments of the invention.

FIG. 6 is a diagram illustrating an apparatus in the form of a system 600 according to various embodiments of the invention. The system 600 may include a processor 610, a memory device 620, a memory controller 630, a graphic controller 640, an input and output (I/O) controller 650, a display 652, a keyboard 654, a pointing device 656, and a peripheral device 658. A bus 660 couples all of these devices together. A clock generator 670 is coupled to the bus 660 to provide a clock signal to at least one of the devices of the system 600 through the bus 660. The clock generator 670 may include an oscillator in a circuit board such as a motherboard. Two or more devices shown in system 600 may be formed in a single integrated circuit chip.

The memory device 620 may comprise one or more of the global timing generator 110 and the local control circuit 200 including the sense circuit 300 and the pulse generator 400 described herein and shown in the figures according to various embodiments of the invention. The bus 660 may be interconnect traces on a circuit board or may be one or more cables. The bus 660 may couple the devices of the system 600 by wireless means such as by electromagnetic radiations, for example, radio waves. The peripheral device 658 coupled to the I/O controller 650 may be a printer, an optical device such as a CD-ROM and a DVD reader and writer, a magnetic device reader and writer such as a floppy disk driver, or an audio device such as a microphone.

The system 600 represented by FIG. 6 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The global timing generator and the local control circuits shown and described herein are scalable and can program and read memory elements with a reduced latency in a reduced volume of semiconductor material. Embodiments of the invention can be applied to multilevel memory elements that can hold, for example, one of two or more states.

Although specific embodiments have been described, it will be evident that various modifications and changes may be made to these embodiments. For example, the memory element described herein has one of two states. The embodiments may be modified for a multi-state memory element having one of three or more states according to various embodiments of the invention. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
   a global timing generator; and
   a plurality of local control circuits, each local control circuit including
      a circuit to compare a sensed state of a memory element with external data; and
      a pulse generator coupled to the global timing generator, the pulse generator to program the memory element responsive to a timing signal from the global timing generator if the sensed state is not the same as the external data, the pulse generator comprising:
         a first pulse reference signal source, coupled to the memory element through a first transistor circuit, to generate a voltage signal to program a first state into the memory element in response to the timing signal; and
         a second pulse reference signal source, coupled to the memory element through a second transistor circuit, to generate a voltage signal to program a second state that is an inverse of the first state, into the memory element in response to the timing signal.

2. The apparatus of claim 1, wherein the voltage signal generated by the first pulse reference signal source is a declining ramp voltage signal and the voltage signal generated by the second pulse reference signal source is a direct current voltage.

3. The apparatus of claim 1, wherein the memory element comprises a charge trap layer cell, a floating gate transistor, a resistive cell, a magnetoresistive cell or a phase change cell.

4. The apparatus of claim 1, wherein each local control circuit further includes
   a first input coupled to receive the sensed state of the memory element; and
   a second input coupled to receive the external data from an external source.

5. The apparatus of claim 4, wherein the first input is coupled to a sense circuit to sense the state of the memory element, the sense circuit being coupled to the memory element.

6. The apparatus of claim 5, wherein the sense circuit is coupled to the global timing generator to receive a verify signal to sequence a read or a verify operation for the memory element.

7. A method comprising:
   comparing a sensed state of a memory element with external data in a local control circuit; and
   programming the memory element responsive to a timing signal from a global timing generator if the sensed state is not the same as the external data, wherein the programming further comprises:
      a first pulse reference signal source generating a first voltage signal to program a first state into the memory element responsive to the timing signal; and
      a second pulse reference signal source generating a second voltage signal to program a second state, inverse to the first state, into the memory element responsive to the timing signal.

8. The method of claim 7, wherein the timing signal comprises a first timing signal, the method further comprising sensing the state of the memory element with a sense circuit in the local control circuit responsive to a second timing signal from the global timing generator.

9. The method of claim 7, further comprising receiving the external data from a source outside of a memory device in which the memory element, the global timing generator and the local control circuit are disposed.

10. An apparatus comprising:
    a global timing generator coupled to a plurality of local control circuits, each local control circuit to control programming and reading of a memory element in a tile of memory elements in an array of memory elements responsive to a timing signal from the global timing generator, wherein each local control circuit comprises:
       a first pulse reference signal source, coupled to the memory element through a first transistor circuit, to generate a first voltage signal to program a first state into the memory element in response to the timing signal; and
       a second pulse reference signal source, coupled to the memory element through a second transistor circuit, to generate a second voltage signal to program a second state that is an inverse of the first state, into the memory element in response to the timing signal.

11. The apparatus of claim 10, wherein each local control circuit comprises:
    a sense circuit to sense a state of the memory element;
    a circuit to compare the sensed state of the memory element with data to be stored in the memory element; and
    a pulse generator to generate a pulse to program the memory element.

12. The apparatus of claim 10, wherein the global timing generator comprises a delay chain or a state machine or a microcontroller.

13. The apparatus of claim 11, wherein the sense circuit is coupled to receive a verify signal from the global timing generator to sequence a read operation or a verify operation.

14. The apparatus of claim 11, wherein the pulse generator is coupled to receive a timing signal from the global timing generator to indicate that the memory element is to be programmed.

15. A method comprising:
    generating timing signals in a global timing generator for memory elements in an array of memory elements;
    providing the timing signals to a plurality of local control circuits, each local control circuit being coupled to a subset of the memory elements in the array of memory elements, wherein each local control circuit comprises first and second pulse reference signal sources that each program a different respective state into the subset of memory elements in response to the timing signals; and acting on a memory element of the array of memory elements responsive to the timing signals.

16. The method of claim 15, wherein acting on a memory element further comprises programming the memory element with a programming pulse.

17. The method of claim 15, wherein acting on a memory element further comprises sensing a state of the memory element.

18. The method of claim 15, wherein acting on a memory element further comprises verifying a programmed state of the memory element.

19. The method of claim 15, wherein acting on a memory element further comprises:
   generating a pulse reference signal in the global timing generator;
   programming the memory element with a programming pulse generated responsive to the pulse reference signal.

\* \* \* \* \*